(12) United States Patent
Horino et al.

(10) Patent No.: US 8,283,593 B2
(45) Date of Patent: Oct. 9, 2012

(54) WIRE CLEANING GUIDE

(75) Inventors: Masayuki Horino, Tachikawa (JP); Kazuo Fujita, Masashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 1216 days.

(21) Appl. No.: 12/069,984

(22) Filed: Feb. 14, 2008

(65) Prior Publication Data

US 2008/0197168 A1  Aug. 21, 2008

(30) Foreign Application Priority Data

Feb. 15, 2007 (JP) .................................. 2007-34248

(51) Int. Cl.
*B23K 10/00* (2006.01)
(52) U.S. Cl. ......... 219/121.43; 219/121.45; 219/121.48; 219/121.37; 228/205; 228/15.1
(58) Field of Classification Search .............. 219/121.4, 219/121.43, 121.59, 121.48, 121.45, 137.61; 228/8, 15.1
See application file for complete search history.

(56) References Cited

U.S. PATENT DOCUMENTS

| 5,397,420 | A  | * | 3/1995 | Sakakibara et al. | ..... | 156/345.33 |
| 6,700,093 | B2 | * | 3/2004 | Chiou et al. | ............ | 219/121.55 |
| 2009/0039141 | A1 | * | 2/2009 | Clauberg et al. | .............. | 228/205 |
| 2009/0050609 | A1 | * | 2/2009 | Berger et al. | ............ | 219/121.64 |
| 2011/0079242 | A1 | * | 4/2011 | Reiss | ............................. | 134/1.1 |

FOREIGN PATENT DOCUMENTS

| JP | 61-058246 | 3/1986 |
| JP | 2723280 | 8/1990 |
| JP | 05-211196 | 1/1993 |
| JP | 61-214530 | 9/1996 |
| JP | 2000-340599 | 12/2000 |
| JP | 2002-083837 | 3/2002 |

* cited by examiner

*Primary Examiner* — Mark Paschall
(74) *Attorney, Agent, or Firm* — DLA Piper LLP (US)

(57) ABSTRACT

A wire cleaning guide for guiding a wire in a feed direction and to clean the wire, including a gas supply nozzle for supplying plasma generating gas, a plasma generating chamber with plasma generating gas supplied from the gas supply nozzle thereto for transforming the plasma generating gas into plasma by energizing a bonding wire that passes there through to clean the wire by means of the plasma gas, and wire-feeder-side and bonding-tool-side guide holes for guiding the wire in the feed direction, the diameter of the wire-feeder-side guide hole is greater than that of the bonding-tool-side guide hole so that the outflow rate of gas after wire cleaning flowing between the wire-feeder-side guide hole and the wire is greater than that of gas after wire cleaning flowing between the bonding-tool-side guide hole and the wire.

6 Claims, 9 Drawing Sheets

WIRE CLEANING GUIDE

BACKGROUND OF THE INVENTION

The present invention relates to a structure of a wire cleaning guide to be used in wire bonding apparatuses and the like.

In semiconductor production processes, wire bonders are often used to provide connections between semiconductor dies and lead frames through metal wires. In such wire bonders, gold wires are used as connection wires. However, with the recent demand for faster and lower-cost semiconductors, metal wires other than gold, such as copper, are often used as connection wires due to its lower-cost but higher-speed signal processing performance.

The surface of metal wires such as copper is likely to be oxidized and covered with an oxide film if left in a high-temperature state or in the atmosphere for a long time. Such an oxide film causes a poor connection during wire bonding and results in a problem of deterioration in bonding quality.

Japanese Patent Application Unexamined Publication Disclosure No. 61-58246 discloses a technique for preventing heat induced surface oxidation by spraying inert gas onto a base metal wire such as copper between a wire feeder and a capillary as a bonding tool to prevent the surface of the base metal wire from being oxidized by the heating of the semiconductor dies and lead frames when using such wires for wire bonding.

Meanwhile, there has been employed a method for gold wires in which wires are coated with resin, for example, to prevent the occurrence of a short circuit between the wires after wire looping. However, in the case of using a coated wire for wire bonding, it is necessary to remove coating on the surface of the wire to expose its metal surface. As a technique for removing the coating on the surface of wires, there has been proposed a method, as disclosed in Japanese Patent Application Unexamined Publication Disclosure No. 5-211196, in which an induction coil is provided at the leading end of a bonding tool such as a capillary, and when grounding a wire on a lead frame using the bonding tool, a high-frequency current is applied to the induction coil to melt and remove the resin coating on the connection part of the wire, and then the wire is pressed and bonded to the lead frame by the bonding tool while operating an ultrasonic horn to generate a vibration.

There have also been proposed methods, as disclosed in Japanese Patent Application Unexamined Publication Disclosure No. 61-214530, in which resin coating is heated by a laser beam so that the resin on the connection part is melted and removed, and as disclosed in Japanese Patent No. 2723280, in which a wire coated with resin is inserted between discharging electrodes to heat, melt, and remove the resin coating by electrons emitted due to an electric discharge between the discharging electrodes.

Further, as for gold wires, it is often the case that a surface-active agent is applied onto the surface of wires to achieve higher-speed bonding operations. Such a surface-active agent is adapted to evaporate near the leading end of a bonding tool of a high temperature, causing a problem in that organic components contained are fixed firmly to the leading end of the bonding tool as contaminations and cause a gradual deterioration in bonding quality such as wire cutting behavior after a long time of use. It is therefore necessary to replace or clean the bonding tool at a predetermined time interval or after a predetermined number of times of bonding, creating a problem of reduction in bonding efficiency.

In wire bonding apparatuses is used a tensioner for applying a pull force to a wire that is inserted through a capillary as a bonding tool so that the wire does not sag. Japanese Patent Application Unexamined Publication Disclosure No. 2002-83837 discloses a tensioner in which the wire-spool side of a cylindrical nozzle holder is provided with a larger wire through hole than the capillary side, and compressed air supplied to the nozzle holder is discharged on either side so that a certain tension is applied to the wire by a fluid resistance that flows upward.

Japanese Patent Application Unexamined Publication Disclosure No. 2000-340599 also discloses a technique of cleaning electrodes on semiconductor chips by jetting gas that is transformed into plasma in a plasma generating section from the leading end gas ejection opening to the electrodes.

The conventional art disclosed in Japanese Patent Application Unexamined Publication Disclosure Nos. 5-211196 and 61-214530 and Japanese Patent No. 2723280 are methods for removing extraneous matters on the surface of wires. Although these conventional arts can remove resin coating on the surface of wires through a high-temperature heat treatment such as induction heating, laser heating, or discharge heating, the high-temperature treatment suffers from a problem in that the surface of the wires is oxidized and covered with an oxide film during the treatment. On the other hand, there is also a method of preventing wire oxidation by flowing inert gas in a discharge section as disclosed in Japanese Patent No. 2723280. However, there is a problem that it is difficult to remove oxide films formed on the surface of wires. In addition, the high-temperature treatment can cause the mechanical and/or electrical characteristics of wires to be changed, even if the oxide films can be removed, causing a problem in that the changes can cause poor connections and/or poor operation due to a reduction in adhesive performance. Further, in such a case of using a tensioner as disclosed in Japanese Patent Application Unexamined Publication Disclosure No. 2002-83837, the surface of wires at a high temperature is exposed to air containing oxygen to be further oxidized, creating a further a problem in that the problem of poor wire connections due to surface oxidation gets worse. Thus, the conventional arts disclosed in Japanese Patent Application Unexamined Publication Disclosure Nos. 5-211196 and 61-214530 and Japanese Patent No. 2723280 suffer from a problem in that foreign substances such as oxide films on the surface of wires cannot be removed effectively.

Although the conventional art disclosed in Japanese Patent Application Unexamined Publication Disclosure No. 61-58246 can prevent thermal oxidation just before bonding of copper wires on which surface oxidation has not yet occurred, oxide films that have already been formed on the surface cannot be removed. This always requires copper wires with no surface oxidation thereon to be used for bonding, causing a problem of limiting available wires. Also, if copper wires that have had oxide films formed on the surface thereof are used, the oxide films cannot be removed, creating a problem of deterioration in bonding quality such as a poor connection due to reduction in adhesive performance of the wires.

Also, for the same reason as above, the conventional arts disclosed in Japanese Patent Application Unexamined Publication Disclosure Nos. 61-58246, 5-211196 and 61-214530 and Japanese Patent No. 2723280 suffer from a problem in that surface-active agents applied onto the surface of gold wires cannot be removed effectively and/or easily.

Further, in such a conventional method of jetting plasma gas onto a to-be-cleaned body as disclosed in Japanese Patent Application Unexamined Publication Disclosure No. 2000-

340599, the plasma gas is jetted from one side. Therefore, even if the method can be applied to wire cleaning, the entire circumference of the wire cannot be cleaned uniformly, suffering from a problem in that a poor connection can occur partially. Also, in such a method of blowing plasma gas against a wire, the jet changes the path as well as the tension of the wire, causing deterioration in bonding quality such as a poor connection.

BRIEF SUMMARY OF THE INVENTION

It is an object of the present invention to remove foreign substances on the surface of a wire effectively on the path of the wire during bonding.

The wire cleaning guide of the present invention, which is for guiding a wire in a feed direction and cleaning the wire, includes:
   a gas supply nozzle for supplying plasma generating gas;
   a plasma generating chamber with plasma generating gas supplied from the gas supply nozzle thereto for transforming the plasma generating gas into plasma by energizing a bonding wire that passes there through to clean the wire by means of the plasma gas, said plasma generating chamber being installed between a wire feeder and a bonding tool; and
   wire-feeder-side and bonding-tool-side guide holes for guiding the wire in the feed direction, the diameter of the wire-feeder-side guide hole is greater than that of the bonding-tool-side guide hole so that the outflow rate of gas after wire cleaning flowing between the wire-feeder-side guide hole and the wire is greater than that of gas after wire cleaning flowing between the bonding-tool-side guide hole and the wire.

The above-described wire cleaning guide of the present invention may further includes insulation bushings secured to the holes for electrically insulating between the wire and the plasma generating chamber.

In another aspect of the present invention, the wire cleaning guide, which is for guiding a wire in a feed direction and cleaning the wire, includes:
   a gas supply nozzle for supplying plasma generating gas; and
   a plasma generating chamber with plasma generating gas supplied from the gas supply nozzle thereto for transforming the plasma generating gas into plasma by energizing a bonding wire that passes there through to clean the wire by means of the plasma gas, the plasma generating chamber including,
      plasma space partition members provided, respectively, on the wire feeder side and the bonding tool side and each including a plasma attenuation hole for inserting the wire there through and for attenuating the plasma, and
      covers provided on the wire feeder side and the bonding tool side of the respective plasma space partition members and each including a guide hole for guiding the wire in the feed direction and a gas discharge nozzle for discharging gas after wire cleaning out of said plasma generating chamber.

In the wire cleaning guide according to the present invention as described above, the wire cleaning guide may further include a gas purification mechanism including a filter for filtering foreign substances in the gas after wire cleaning discharged through each gas discharge nozzle and a recirculation flow path for resupplying the gas passing through the filter to the plasma generating chamber as plasma generating gas.

Furthermore, the wire cleaning guide of the present invention may further include a dielectric holding coil provided in the plasma generating chamber along the wire feed direction and having a center hole for inserting the wire there through.

The present invention exhibits an advantageous effect that foreign substances on the surface of the wire can be removed effectively on the path of the wire during bonding.

BRIEF DESCRIPTION OF THE SEVERAL VIEWS OF THE DRAWINGS

The above mentioned features and objects of the present invention will become more apparent from the following description taken in conjunction with the following drawings wherein like reference numerals denote like elements and in which.

DETAILED DESCRIPTION OF THE INVENTION

Hereinafter, preferred embodiments of the present invention will be concretely described with reference to the accompanying drawings.

Figure 1:
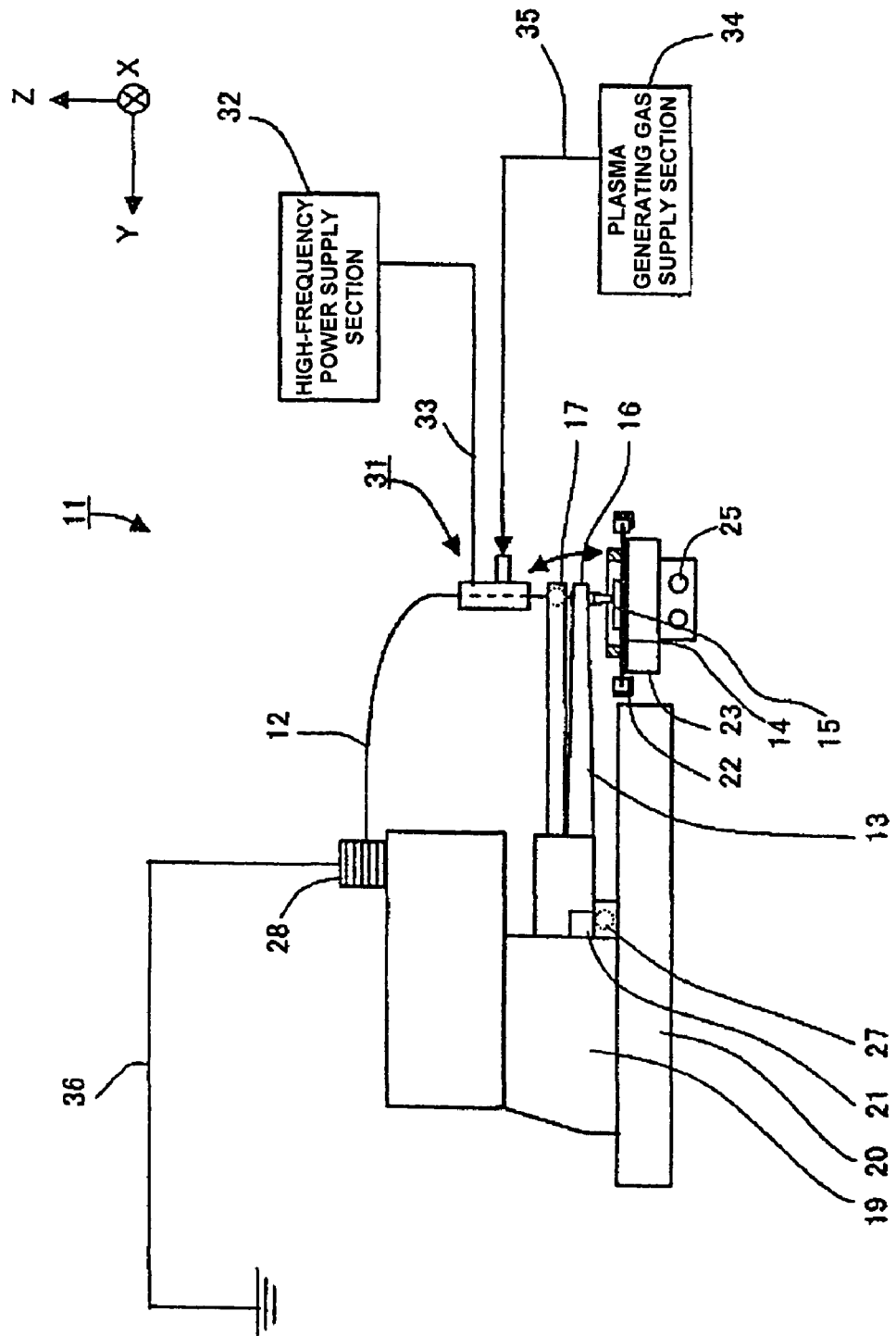
FIG. 1 is an illustrative view showing the configuration of a wire bonding apparatus according to the present invention.

A wire cleaning guide according to a preferred embodiment of the present invention will hereinafter be described with reference to the accompanying drawings. As shown in FIG. 1, in a wire bonding apparatus 11, a bonding head 19 is mounted on an X-Y table 20, and a bonding arm 13 and a damper 17 are attached to the bonding head 19. At the leading end of the bonding arm 13 is installed a capillary 16 as a bonding tool, while at the base end of the bonding arm 13 is installed an ultrasonic oscillator 21 for supplying ultrasonic energy to the capillary 16 at the leading end.

On the bonding head 19 is provided a spool 28 as a wire feeder around which a wire 12 for connecting pad surfaces on a semiconductor die 15 and a lead frame 14 is wound. Between the spool 28 as a wire feeder and the capillary 16 as a bonding tool is provided a wire cleaning guide 31 for cleaning and guiding the wire 12 in a feed direction. In the present embodiment, the wire cleaning guide 31 is provided between the damper 17, which is provided adjacent to the bonding arm 13, and the spool 28, but the position is not restricted thereto, and it can be provided between the bonding arm 13 and the damper 17 as well as provided between the spool 28 and the capillary 16. Since the spool 28 is grounded, the wire 12 is also grounded through the spool 28. The wire 12, which is wound around the spool 28, is fed from the spool 28 and guided through the wire cleaning guide 31 and is inserted through the center hole of the capillary 16 via the damper 17. The wire cleaning guide 31 is connected with a power line 33 from a high-frequency power supply section 32 for plasma generation and a gas supply line 35 for supplying plasma generating gas from a plasma generating gas supply section 34.

The X-Y table 20 allows the bonding head 19 to be moved and positioned freely on a plane (X-Y plane) along the bonding plane. The bonding arm 13, which is attached to the bonding head 19, is driven about its rotation center 27 by a high-speed Z motor so that the capillary 16 at the leading end thereof is driven in the Z direction, i.e., the vertical direction and the damper 17 is driven vertically with the bonding arm 13.

Two carrying guides 22 for guiding the lead frame 14 are provided on a side of the X-Y table 20 corresponding to the leading end of the bonding arm 13, and the lead frame 14 with the semiconductor die 15 mounted thereon is to be carried in the X direction shown in the drawing by the carrying guides 22. Between the carrying guides 22 is provided a bonding stage 23 for bonding, and the lead frame 14 carried on the bonding stage 23 is to be sucked and fixed to the bonding stage 23. The bonding stage 23 is provided with a heater 25 for heating the lead frame 14 that is sucked and fixed thereon.

The operation of the thus arranged wire bonding apparatus 11 will be described briefly. When the lead frame 14 is carried by the carrying guides 22 and brought onto the bonding stage 23, the lead frame 14 is sucked and fixed to the bonding stage 23 and heated. When the capillary 16 at the leading end of the bonding arm 13 is positioned over a pad on the semiconductor die 15 by the X-Y table 20, the bonding arm 13 is moved downward by the high-speed Z motor to cause the capillary 16 to press the wire 12 against the semiconductor die 15 and to cause the ultrasonic oscillator 21 to oscillate the capillary 16 so that the wire 12 is bonded to the semiconductor die 15. Subsequently, the bonding arm 13 is lifted and the capillary 16 is positioned over a pad on the lead frame 14 for similar bonding of the wire 12. After the bonding of the wire 12 to the lead frame 14, the damper 17 is closed to hold the wire 12 and lifted together with the bonding arm 13 to cut the wire 12. Repeating this operation for each pair of pads on the semiconductor die 15 and the lead frame 14 provides connections between the semiconductor die 15 and the lead frame 14 through the wires 12. Then, the wire 12 for the connection between the semiconductor die 15 and the lead frame 14 is fed from the spool 28 to the capillary 16 while being cleaned through the wire cleaning guide 31.

Figure 2:
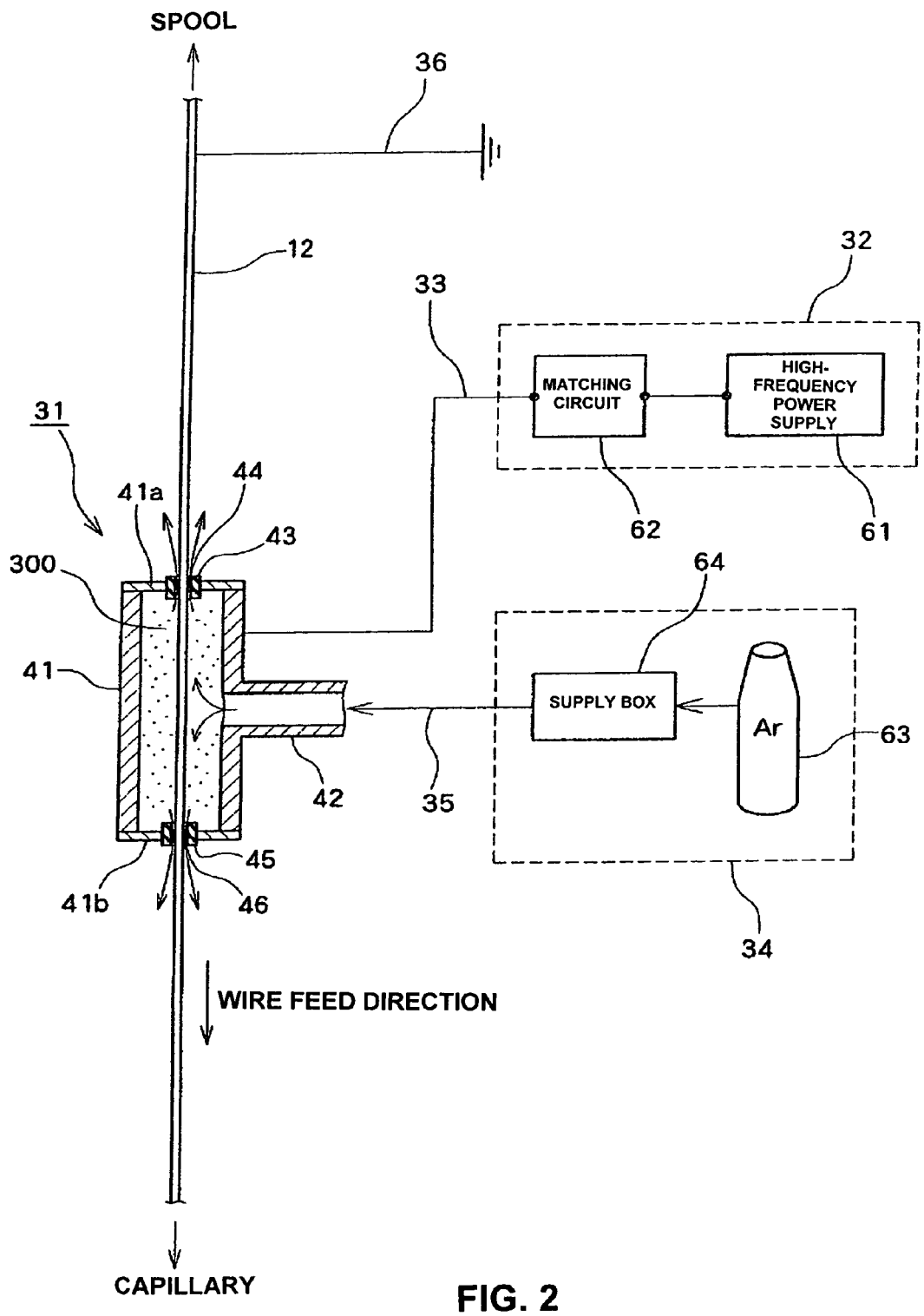
FIG. 2 is an illustrative view showing the configuration of a wire cleaning guide according to a first embodiment of the present invention.

A wire cleaning guide 31 according to a first embodiment will be described in detail with reference to FIG. 2. The wire cleaning guide 31 includes a plasma generating chamber 41, a gas supply nozzle 42 for supplying plasma generating gas, and insulation bushings 43 and 45. The plasma generating chamber 41 has a cylindrical shape made of metal such as stainless steel with an inside space for generating plasma and is provided with end plates 41a and 41b, respectively, on the spool and capillary sides. The insulation bushings 43 and 45 are fixed to the center of the respective end plates 41a and 41b. The insulation bushings 43 and 45 are each composed of an insulation member and include guide holes 44 and 46 at the center thereof for guiding the wire 12 there through to guide the wire 12 as well as to provide electrical isolation between the metal wire 12 and the metal plasma generating chamber 41. Also, the insulation bushings 43 and 45 are adapted to keep the metal wire 12 separated from the inner wall of the plasma generating chamber 41 inside the plasma generating chamber 41. The plasma generating chamber 41 includes the wire 12 arranged on the center thereof and has a cylindrical shape so that plasma can be generated substantially uniformly around the wire 12, but can have a multi-sided shape such as a four-sided cylindrical shape as long as it is capable of generating plasma substantially uniformly around the wire 12.

The gas supply nozzle 42 of the plasma generating chamber 41 is connected to the plasma generating gas supply section 34 via a gas duct. The plasma generating gas supply section 34 has a function of supplying plasma generating gas and includes a gas source 63 for plasma, a supply box 64 for supplying gas fed from the gas source 63 to the plasma generating chamber 41, and various ducts for connecting these components. The plasma generating gas, which is argon gas in the present embodiment, can be other inert gases such as nitrogen, helium, or neon. Alternatively, reducing gas or oxidizing gas can be mixed in the supply box 64 at an appropriate mixture ratio according to foreign substances adherent to the surface of the wire 12 and supplied to the plasma generating chamber 41. Mixing reducing gas would allow oxide films and the like on the surface of the wire 12 to be reduced and thereby removed, while mixing oxidizing gas would allow organic matters on the surface of the wire to be removed more effectively. For example, the reducing gas can be hydrogen gas, while the oxidizing gas can be oxygen gas. The reducing gas is not restricted to hydrogen, and can be other gases as long as they have a reducing function. Also, the oxidizing gas is not restricted to oxygen, and can be other gases as long as they have an oxidizing function. It is noted that since the amount of gas to be consumed is small, each gas can be supplied from a small gas bottle. It will be appreciated that exclusive ducts can be connected externally to the supply box 64.

The metal plasma generating chamber 41 is connected with the high-frequency power supply section 32 for plasma generation via the power line 33. The high-frequency power supply section 32 has a function of supplying high-frequency power for continuous plasma generation to the metal plasma generating chamber 41 as an electrode, including a matching circuit 62 and a high-frequency power supply 61. The matching circuit 62 is adapted to suppress power reflection when supplying high-frequency power to the plasma generating chamber 41 as an electrode. The high-frequency power supply 61 can employ a power supply of a frequency of, for example, 100 to 500 MHz. The magnitude of the power to be supplied is determined based upon the type and flow rate of gas to be supplied from the plasma generating gas supply section 34 and the stability of plasma, etc.

The wire 12, which runs through the inside of the plasma generating chamber 41 and is grounded via the spool 28 shown in FIG. 1, functions as one electrode for plasma generation when power is supplied from the high-frequency power supply section 32 to the plasma generating chamber 41 at a high frequency.

The operation of the wire cleaning guide 31 will now be described. Plasma 300 is generated in the plasma generating chamber 41 in accordance with the following procedure. An adequate flow rate of plasma generating gas is first supplied from the plasma generating gas supply section 34 into the plasma generating chamber 41. As shown in FIG. 2, the supplied plasma generating gas flows through the gas supply nozzle 42 into the plasma generating chamber 41. The inflow plasma generating gas flows out through the clearance between the guide hole 44 in the insulation bushing 43 on the spool side and the wire 12 as well as the guide hole 46 in the insulation bushing 45 on the capillary side as indicated by the arrows in the drawing. Next, an adequate high-frequency power is supplied from the high-frequency power supply section 32 to the plasma generating chamber 41. The adequate conditions for generating a plasma can be obtained experimentally in advance. Then, if the conditions of the supplied plasma generating gas and the high-frequency power are adequate, the plasma generating gas is transformed into plasma 300 between the plasma generating chamber 41 and the wire 12 as electrodes inside the plasma generating chamber 41. The generated plasma 300 collides substantially equally against the entire circumference of the wire 12 inside the plasma generating chamber 41 to remove foreign substances adherent to the surface of the wire in the entire circumferential direction. The gas after wire cleaning that contains the foreign substances removed from the surface of the wire 12 flows out through the clearance between the guide hole 44 in the insulation bushing 43 on the spool side and the wire 12 as well as the guide hole 46 in the insulation bushing 45 on the capillary side as indicated by the arrows in the drawing.

The wire 12, on the surface of which are adherent foreign substances such as oxide films and/or surface-active agents, is fed through the guide hole 44 in the insulation bushing 43 on the spool side into the plasma generating chamber 41, and then fed out through the guide hole 46 on the capillary side to the capillary 16 after the foreign substances on the surface are removed there through by the plasma. Since the wire cleaning guide 31 is arranged on path of the wire just above the capillary 16, the cleaned wire 12 is guided and fed to the capillary 16 in such a manner as to keep its path with the surface thereof being kept cleaned for bonding to the semiconductor die 15 or the lead frame 14. Therefore, no foreign substance can get into bonding planes and thereby the possibility of the occurrence of a poor connection can be reduced. In addition, since the plasma 300 cleans the entire circumference of the wire 12, the wire 12 has no directionality in cleaning and thereby the entire circumference can be cleaned substantially uniformly, which allows the possibility of a poor connection to be reduced even if the wire 12 can be bonded in any direction. Further, since the plasma 300 provides a low-temperature treatment for cleaning of the wire 12, it is possible to prevent the electrical and/or mechanical characteristics of the wire 12 from being changed and thereby the adhesive performance from being reduced, and further, the low-temperature treatment by the plasma 300 forms small convexo-concaves on the surface of the wire 12 and the small convexo-concaves can improve the bonding performance of the wire 12. This also exhibits an effect that the bonding performance to molded resin can be improved. Furthermore, mixing oxidizing gas allows organic matters on the surface of gold wires to be removed effectively and thereby the life of the capillary 16 to be prolonged. If the wire cleaning guide 31 according to the present embodiment is applied to coated wires, the treatment by the plasma 300 forms small convexo-concaves on the surface of the coated wires, which exhibits an effect that the small convexo-concaves improves the bonding performance to molded resin.

Thus, the wire cleaning guide 31 according to the present embodiment exhibits an effect that foreign substances on the surface of the wire can be removed effectively on the path of the wire during bonding and the bonding performance of the wire 12 can be improved.

Figure 3:
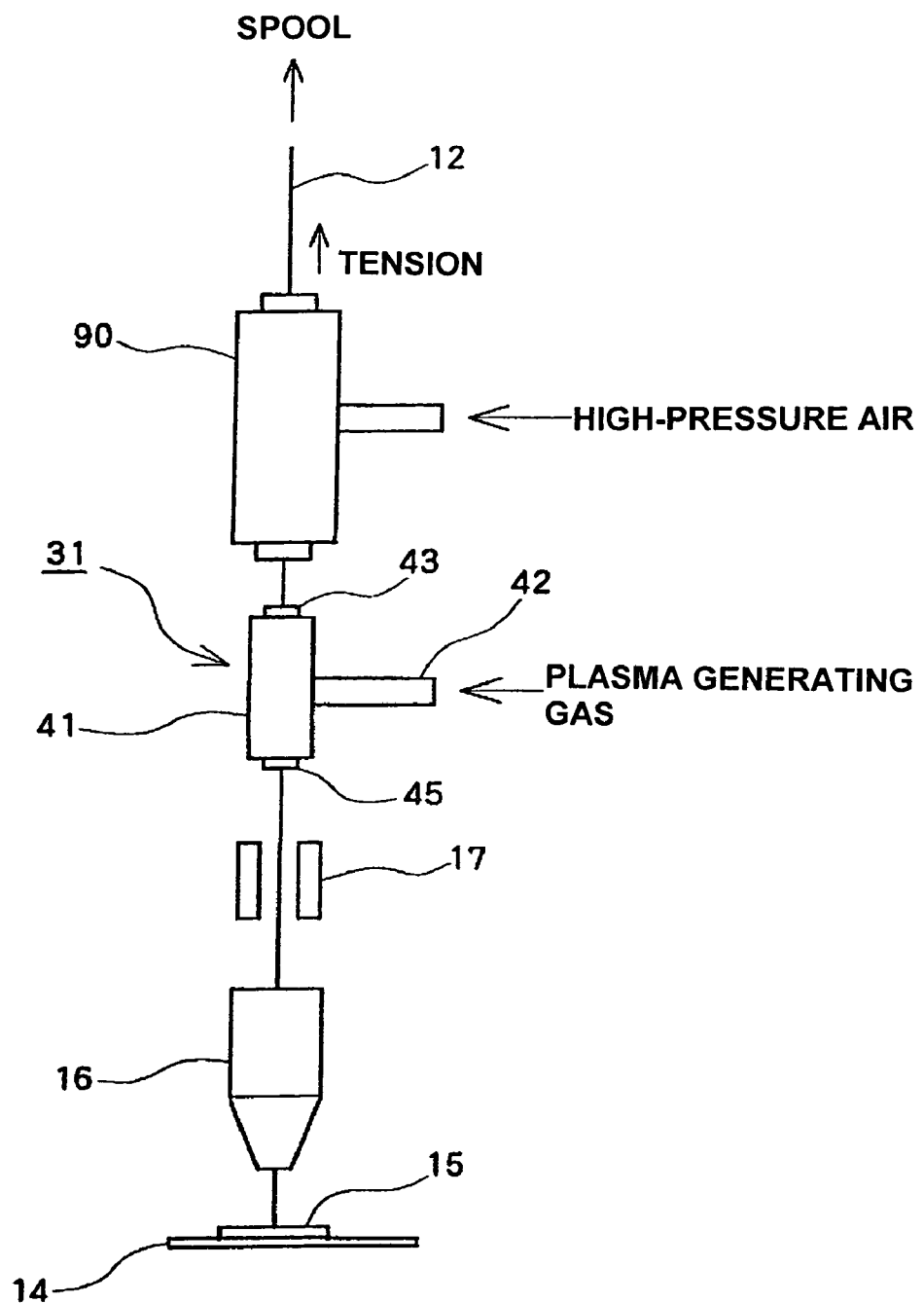
FIG. 3 is an illustrative view showing a configuration where the wire cleaning guide according to the first embodiment of the present invention is arranged on the path of a wire with a tensioner.

As shown in FIG. 3, the wire cleaning guide 31 according to the present embodiment can preferably be arranged with a tensioner 90 for applying a tension to the wire 12 toward the spool. In the tensioner 90, the spool side of a cylindrical nozzle holder is provided with a larger wire through hole than the capillary side, and high-pressure air supplied to the nozzle holder is discharged on either side. In this case, since the amount of discharge air flowing on the spool side is greater than that flowing on the capillary side, a force toward the spool occurs on the wire 12. As shown in FIG. 3, since the leading end of the wire 12 is bonded to the semiconductor die 15 or the lead frame 14 during bonding, the force applies a tension to the wire 12. The wire cleaning guide 31 exhibits an effect, even if an oxide film can be formed on the surface of the wire 12 through the tensioner 90, that the oxide film can be removed effectively on the path of the wire before the wire 12 is fed to the capillary 16, resulting in an improvement in the bonding performance of the wire 12.

Figure 4:
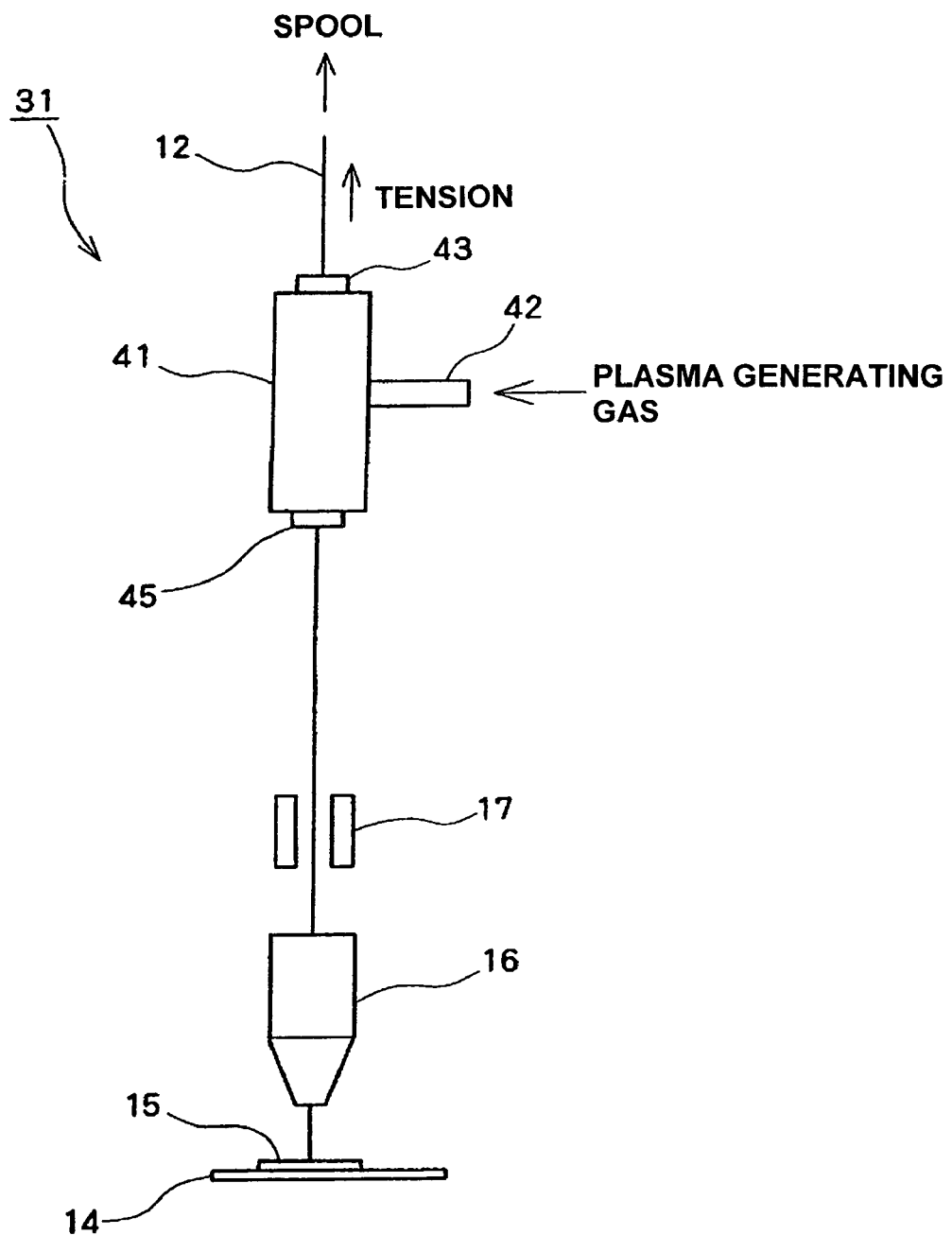
FIG. 4 is an illustrative view showing an arrangement of a wire cleaning guide according to a second embodiment of the present invention.
Figure 5:
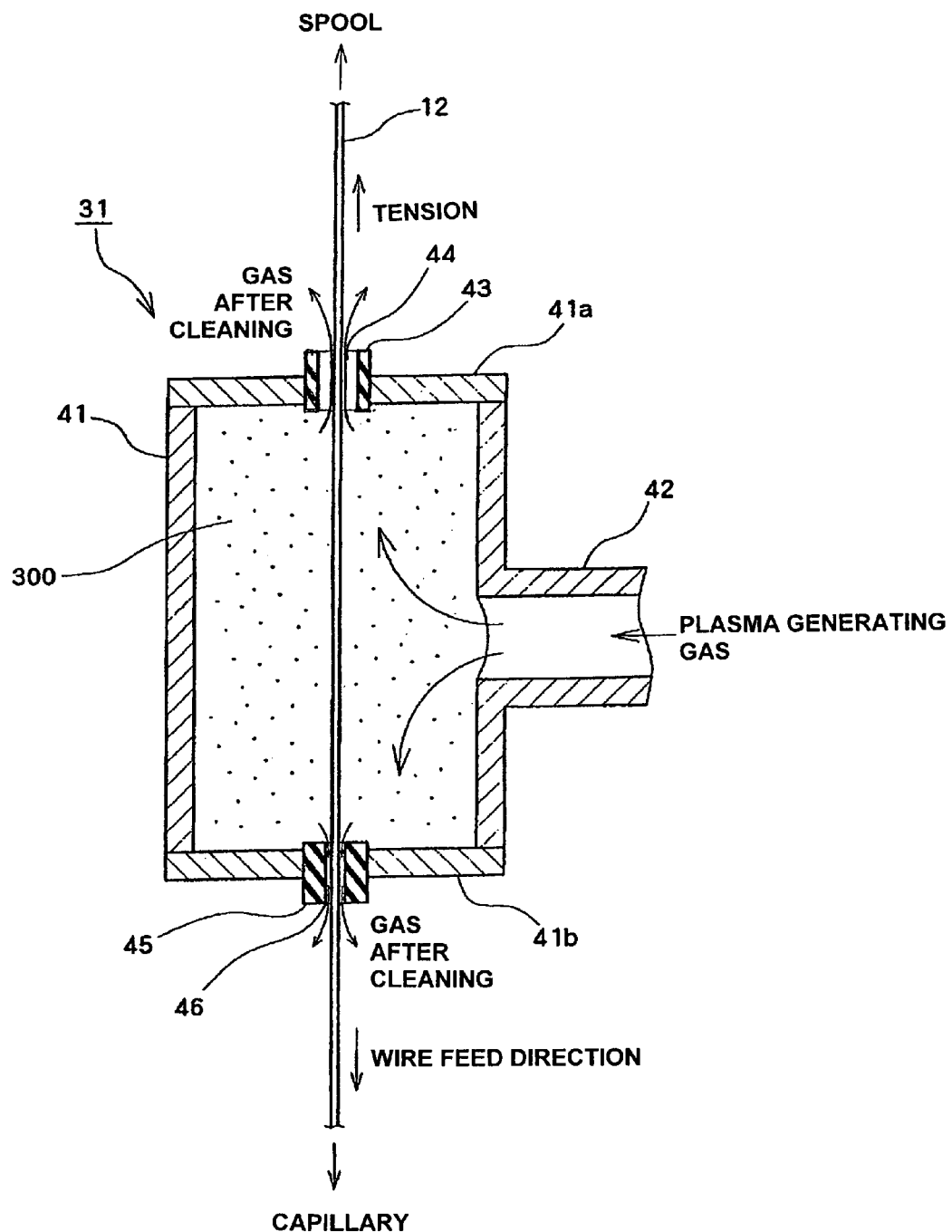
FIG. 5 is a cross-sectional view of a plasma generating chamber in the wire cleaning guide according to the second embodiment of the present invention.

A second embodiment will be described with reference to FIGS. 4 and 5. As shown in FIG. 4, the wire cleaning guide 31 according to the present embodiment can guide and clean the wire 12 as well as apply a tension toward the spool to the wire 12. Components identical to those in the embodiment described with reference to FIGS. 1 to 3 are designated by the same reference numerals and descriptions thereof are omitted. As shown in FIG. 5, in the present embodiment, the size of the guide hole 44 in the insulation bushing 43 on the spool side is greater than that of the guide hole 46 in the insulation bushing 45 on the capillary side so that the discharge amount of gas after cleaning flowing between the guide hole 44 and the wire 12 is greater than that of gas after cleaning flowing between the guide hole 46 and the wire 12. Therefore, since the force toward the spool that is applied to the wire 12 by the flow of gas after cleaning ejected toward the spool is greater than the force toward the capillary that is applied to the wire 12 by the flow of gas after cleaning ejected toward the capillary, the wire 12 is applied with a pull force toward the spool. For example, an aperture ratio of the guide hole 44 to the guide hole 46 is about 5 to 1. In practice, a diameter of the guide hole 44 is about 500 μm and a diameter of the guide hole 46 is about 100 m. This force applies a tension to the wire 12 in the same manner as described above. This tension allows the wire 12, which runs through the inside of the plasma generating chamber 41, to be held straight, a variation of the distance between the wire 12 and the inner surface of the plasma generating chamber 41 to be reduced, and the generation of the plasma 300 to be more stabilized. Also, the tension allows the wire 12, which is inserted through the center hole of the capillary 16, not to sag, whereby the capillary 16 can form the wire 12 in a predetermined shape to connect the semiconductor die 15 and the lead frame 14.

Thus, in addition to the same effects as in the above-described embodiment, the wire cleaning guide 31 according to the present embodiment exhibits an effect that the wire 12, which runs through the inside of the plasma generating chamber 41, can be held straight, the variation in the distance between the wire 12 and the inner surface of the plasma generating chamber 41 can be reduced, and the generation of the plasma 300 can be more stabilized. The wire cleaning guide also exhibits an effect that the wire 12 can be formed in a predetermined shape for connection by applying a predetermined tension to the wire 12 on the path of the wire. The wire cleaning guide further exhibits an effect that a predetermined tension can be applied to the wire 12 without using the tensioner 90, which allows the apparatus to be simplified.

Figure 6:
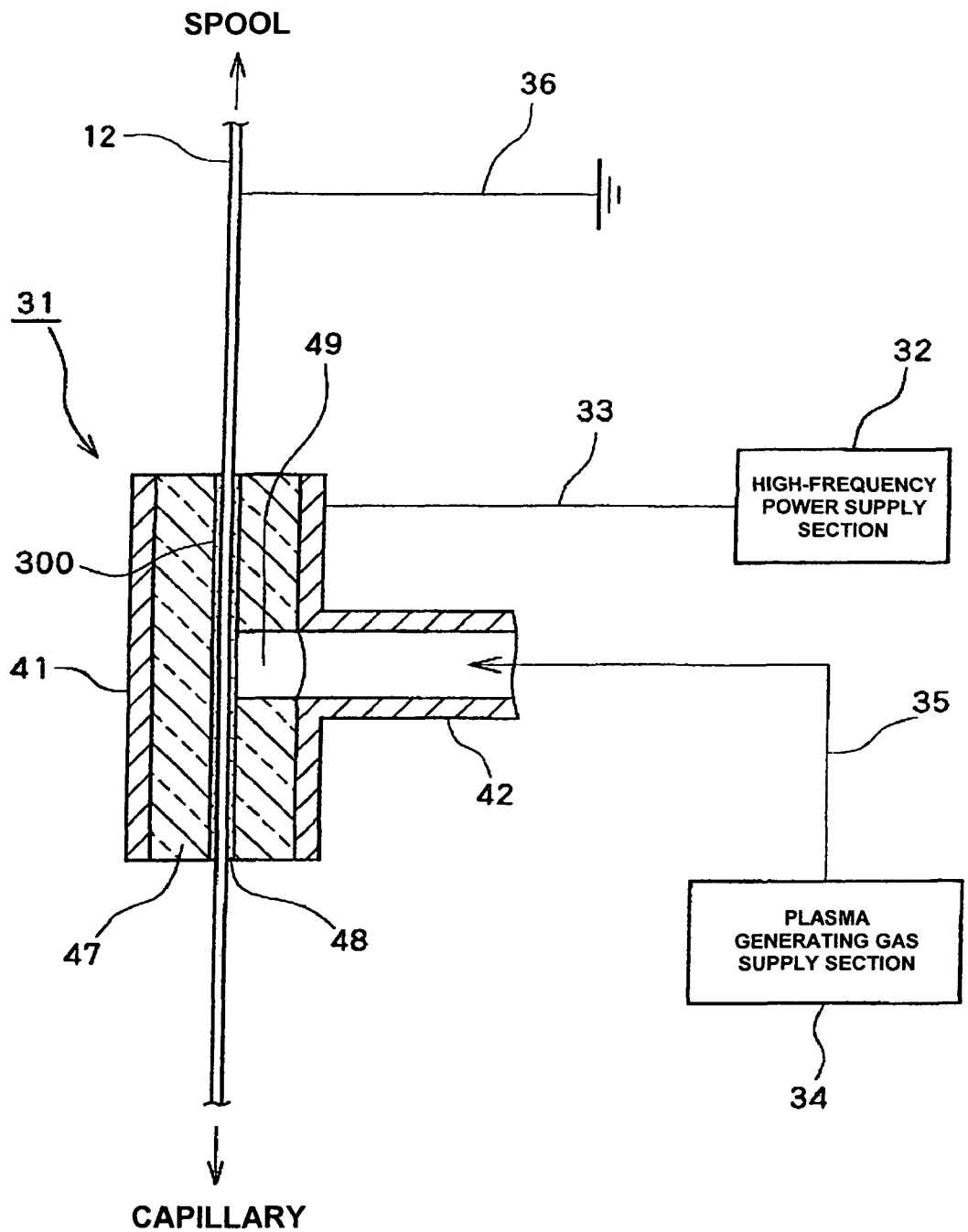
FIG. 6 is an illustrative view showing the configuration of a wire cleaning guide according to a third embodiment of the present invention.

A third embodiment of the present invention will be described with reference to FIG. 6. Components identical to those in the embodiment described with reference to FIGS. 1 to 5 are designated by the same reference numerals and descriptions thereof are omitted. FIG. 6 shows a case where a dielectric 47 such as ceramic or glass is installed inside the plasma generating chamber 41, and the wire 12 is inserted through a guide hole 48 that is opened inside the dielectric 47. Since the dielectric 47 is made of insulating material such as ceramic or glass, the wire 12 can be electrically isolated from the metal plasma generating chamber 41 to be guided. For example, if the diameter of the wire 12 is 20 to 30 μm, the diameter of the guide hole 48 in the dielectric 47 can be 100 to 200 μm. Also, a gas supply hole 49 for communication between the gas supply nozzle 42 and the guide hole 48 is provided in a lateral part of the dielectric 47. The dielectric 47 can be formed in an integrated manner or can be divided into multiple parts along the insertion direction of the wire 12, for example. In the same manner as in the above-described embodiment, the plasma generating chamber 41, which is made of metal such as stainless steel, is connected with the high-frequency power supply section 32 via the power line 33, and the wire 12 is grounded via the spool 28 in the manner as shown in FIG. 1.

The operation of the thus arranged wire cleaning guide 31 will now be described. Plasma generating gas supplied from the plasma generating gas supply section 34 to the guide hole 48 in the dielectric 47 through the gas supply nozzle 42 and the gas supply hole 49 flows inside the guide hole 48 toward the spool and the capillary. Then, when an adequate high-frequency power is supplied from the appropriately arranged high-frequency power supply section 32 to the plasma generating chamber 41, the plasma generating gas is transformed into plasma 300 generated between the plasma generating chamber 41 and the wire 12 as electrodes inside the guide hole 48 in the dielectric 47. The magnitude of high-frequency power to be supplied is selected appropriately based on the permittivity of the dielectric 47 and/or the flow rate and type of plasma generating gas to be supplied, etc. The generated plasma 300 collides substantially equally against the entire circumference of the wire 12 inside the guide hole 48 in the dielectric 47 to remove foreign substances adherent to the surface of the wire 12 in the entire circumferential direction. The gas after wire cleaning that contains the foreign substances removed from the surface of the wire 12 flows out through the guide hole 48 in the dielectric 47 toward the spool and the capillary. The present embodiment exhibits the same effects as in the above-described first embodiment.

Figure 7:
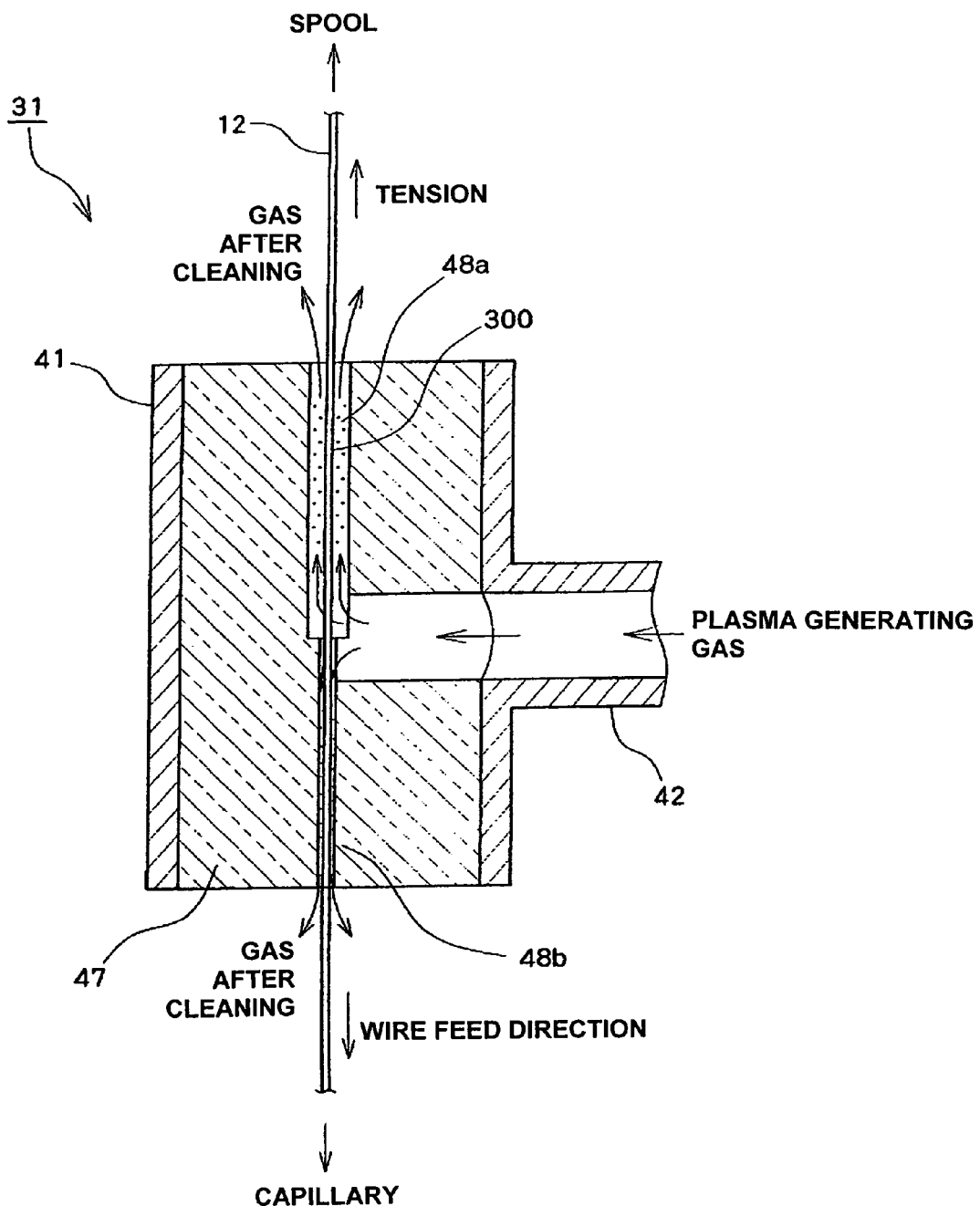
FIG. 7 is a cross-sectional view of a plasma generating chamber in a wire cleaning guide according to a fourth embodiment of the present invention.

A fourth embodiment will be described with reference to FIG. 7. Components identical to those in the embodiment described with reference to FIGS. 1 to 6 are designated by the same reference numerals and descriptions thereof are omitted. In the present embodiment, the spool side of the dielectric 47 is provided with a spool-side guide hole 48a having a larger diameter, while the capillary side is provided with a capillary-side guide hole 48b having a diameter smaller than that of the spool-side guide hole 48a. Plasma generating gas flowing through the gas supply nozzle 42 into the guide holes 48a and 48b is transformed into plasma 300 generated between the plasma generating chamber 41 and the wire 12 as electrodes. The plasma 300 removes foreign substances on the surface of the wire 12 and flows out toward the spool and the capillary. Since the diameter of and therefore the flow rate of gas after cleaning flowing through the spool-side guide hole 48a is greater than that of the capillary-side guide hole 48b, as is the case in the above-described second embodiment, the wire 12 is applied with a force toward the spool by the flow of the gas and then is applied with a tension by the force. This tension allows the wire 12, which runs through the inside of the guide holes 48a and 48b, to be held straight. Then, the wire 12 is formed in a predetermined shape by the capillary 16 to connect the semiconductor die 15 and the lead frame 14. The present embodiment exhibits the same effects as in the above-described first embodiment.

Figure 8:
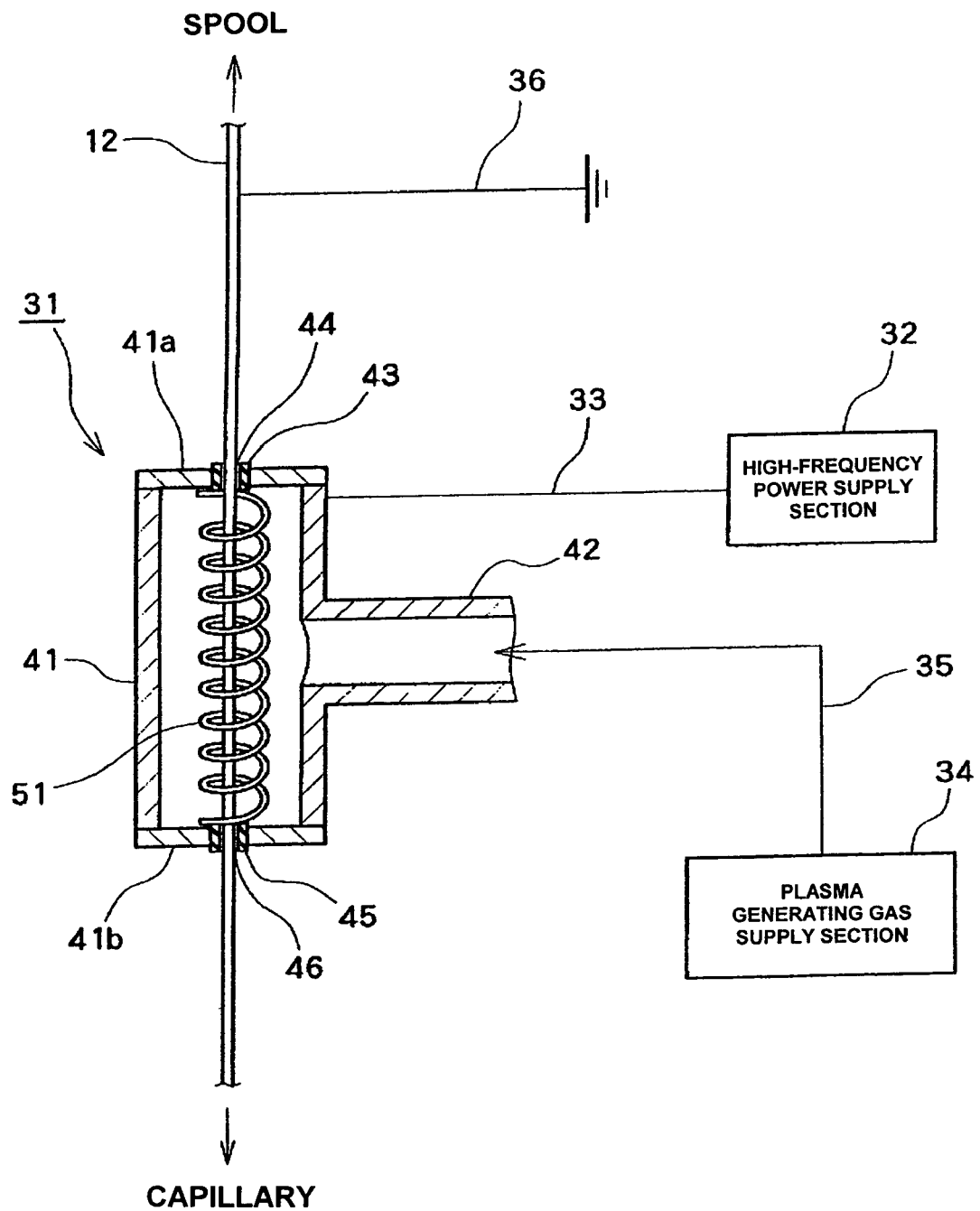
FIG. 8 is an illustrative view showing the configuration of a wire cleaning guide according to a fifth embodiment of the present invention.

A fifth embodiment will be described with reference to FIG. 8. Components identical to those in the embodiments described with reference to FIGS. 1 to 7 are designated by the same reference numerals and descriptions thereof are omitted. As shown in FIG. 8, in the present embodiment, a holding coil 51 for holding the wire 12 in the insertion direction is provided inside the plasma generating chamber 41. The other arrangements are the same as in the above-described first embodiment. The holding coil 51 is composed of a dielectric member such as ceramic or glass and has a hole formed in the center of the coil to insert the wire 12 there through. This arrangement exhibits an effect that the position of the wire 12 can be held so as not to be varied by the flow of the plasma generating gas so that the distance between the wire 12 and the plasma generating chamber 41 is constant, which allows the plasma to be generated more stably. Also in the present embodiment, the size of the guide hole 44 in the insulation bushing 43 on the spool side can preferably be greater than that of the guide hole 46 in the insulation bushing 45 on the capillary side so that the wire 12 is applied with a tension toward the spool.

Figure 9:
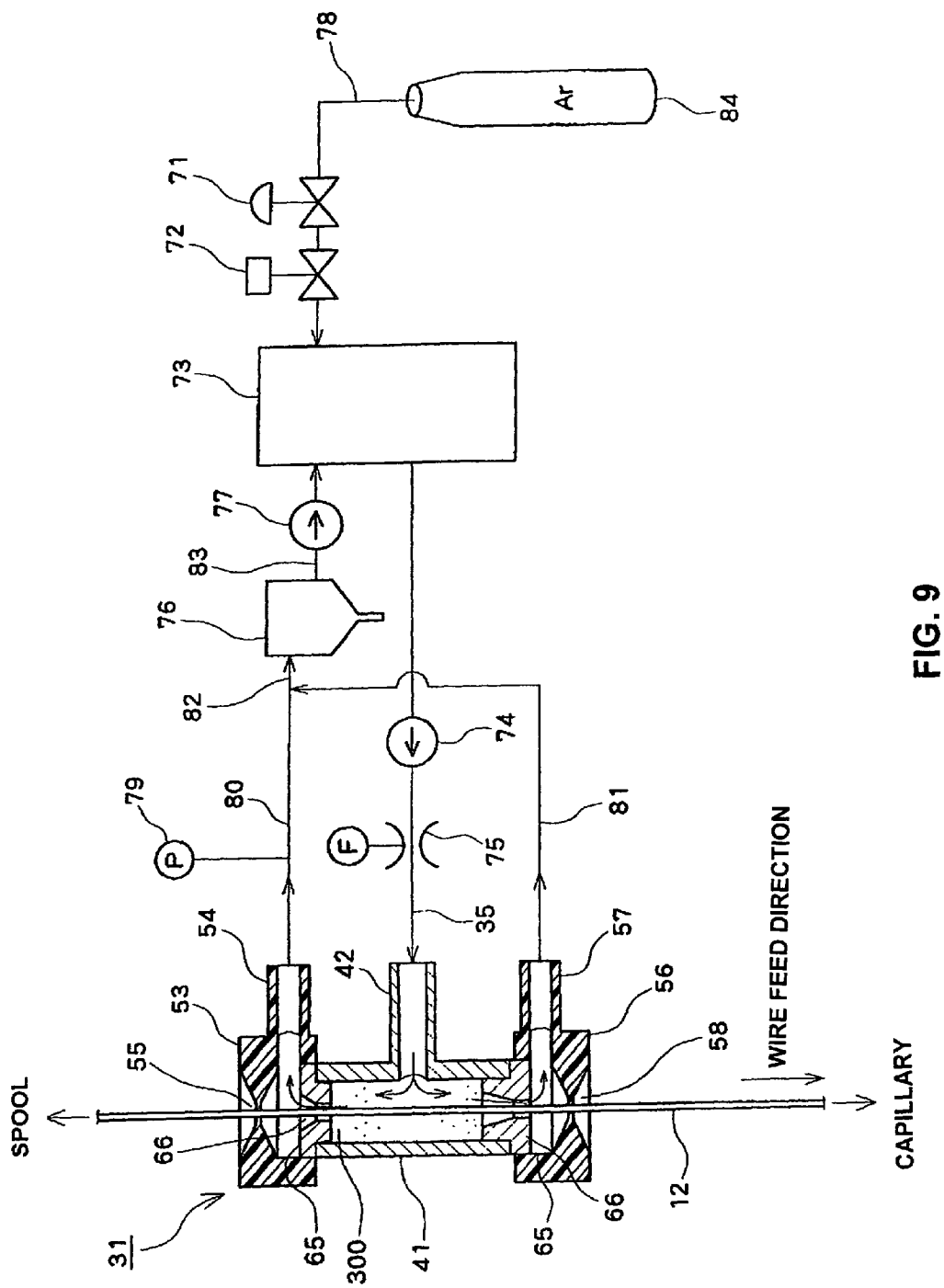
FIG. 9 is an illustrative view showing the configuration of a wire cleaning guide according to a sixth embodiment of the present invention.

A sixth embodiment will be described with reference to FIG. 9. Components identical to those in the embodiments described with reference to FIGS. 1 to 8 are designated by the same reference numerals and descriptions thereof are omitted. As shown in FIG. 9, in the wire cleaning guide 31 according to the present embodiment, plasma space partition members 65 are installed, respectively, on the spool side and the capillary side of the plasma generating chamber 41 that is made of metal such as stainless steel, and an insulating spool-side cover 53 and another insulating cover 56 are installed on the spool side and the capillary side of the respective plasma space partition members 65. The plasma space partition members 65 are each adapted to attenuate plasma generated in the plasma generating chamber 41 through a plasma attenuation hole 66 at the center thereof so that the plasma area inside the plasma generating chamber 41 can be separated from the external area by preventing the plasma 300 generated in the plasma generating chamber 41 from extending into the spool-side and capillary-side covers 53 and 56. Also, the wire 12 is inserted through each plasma attenuation hole 66. Pinholes 55 and 58 for inserting the wire 12 there through are provided at the center of the respective covers 53 and 56, and discharge nozzles 54 and 57 for discharging gas after cleaning are provided on the lateral side of the respective covers 53 and 56.

The pinholes 55 and 58 at the center of the respective covers 53 and 56 are adapted to guide the wire 12 slidably while having a small clearance with the wire 12 and have a structure whereby the wire 12 can move in the feed direction and the gas leakage between the wire 12 and the covers 53 and 56 can be reduced. Also, the plasma attenuation holes 66 in the respective plasma space partition members 65, which are only required to be capable of attenuating plasma at portions where the inner diameter decreases, each have a structure broadened in a tapered manner toward the spool so that the wire 12 can be inserted easily there through. Further, the surface of the tapered portions has a smooth structure so that the flexible wire 12 can be inserted.

In the present embodiment, plasma generating gas supplied through the gas supply nozzle 42 into the plasma generating chamber 41 is transformed into plasma 300 to clean the surface of the wire 12. The plasma 300 generated in the plasma generating chamber 41 attenuates through the plasma attenuation holes 66 in the respective plasma space partition members 65 to subsequently be discharged outside the plasma generating chamber 41 through the discharge nozzles 54 and 57 in the respective covers 53 and 56 as gas after cleaning. Since the clearances between the covers 53 and 56 and the wire 12 are small, only an extremely small amount of gas after cleaning is to be discharged through the clearances and the most of the gas after cleaning is discharged through the discharge nozzles 54 and 57. Thus, in the wire cleaning guide 31 according to the present embodiment, most of the gas after cleaning is discharged through the discharge nozzles 54 and 57.

Since the discharged gas after cleaning contains particles of oxide films and/or organic matters that are removed by cleaning the wire 12, the particles contained in the gas after cleaning can adhere to the bonding apparatus, if the gas is discharged directly around the bonding apparatus, to cause a deterioration in bonding quality. Hence, as shown in FIG. 9, the present embodiment is arranged in such a manner as to treat the gas after cleaning through a gas circulation/purification system for retreating and reusing the gas after cleaning. The gas supply nozzle 42 of the plasma generating chamber 41 is connected with a gas supply line 35 for supplying argon gas as plasma generating gas stored in a buffer tank 73, and the gas supply line 35 includes a pump 74 for increasing the pressure of the plasma generating gas and a flow meter 75. The discharge nozzles 54 and 57 in the respective covers 53 and 56 of the plasma generating chamber 41 are connected, respectively, to gas discharge lines 80 and 81. The gas discharge line 80 includes a pressure gauge 79 and the gas discharge lines 80 and 81 are connected to an inlet duct 82 of a filter 76. An outlet duct 83 of the filter 76 is connected to a compressor 77 and the compressor 77 is connected to the buffer tank 73. The buffer tank 73 is also connected with a gas replenishment line 78 and the gas replenishment line 78 includes a decompression valve 71 for reducing the pressure of argon gas in a gas bottle 84 and a shutoff valve 72 for shutting off the supply of the gas.

The plasma generating gas stored in the buffer tank 73 is compressed by the pump 74 and supplied through the gas supply nozzle 42 into the plasma generating chamber 41 at a predetermined flow rate. The flow rate is measured by the flow meter 75 and the rotational speed of the pump 74 is, for example, adjusted to achieve the predetermined flow rate. The plasma generating gas flowing into the plasma generating chamber 41 is transformed into plasma 300 by high-frequency power energization to clean the wire 12 and then discharged through the discharge nozzles 54 and 57 as gas after cleaning. The pressure of the discharge gas is monitored by the pressure gauge 79 and the flow rate of the plasma generating gas is adjusted to make the discharge pressure higher than the atmospheric pressure so that air does not flow into the system. The discharged gas after cleaning passes through the gas discharge lines 80 and 81 to flow into the filter 76 through the inlet duct 82. The filter 76 has a function of removing particles of oxide films and/or organic matters that are removed from the wire 12 and contained in the gas after cleaning. For example, it can be arranged, as shown in FIG. 9, that the flow velocity is reduced in the tank so that heavier particles are separated downward or a fibrous filter is used, or these arrangements can be combined. The gas excluding the particles of oxide films and/or organic matters through the filter 76 is compressed by the compressor 77 to flow into the buffer tank 73 and is reused as plasma generating gas. Once the plasma generating gas is decompressed and supplied from the gas bottle 84 to the buffer tank 73, this circulation system can thereafter operate continuously with no gas supply. However, if there is a gas leakage from the system, the shutoff valve 72 is opened to replenish argon gas from the gas bottle 84 into the buffer tank 73. Although the present embodiment describes the case of using argon gas as plasma generating gas, nitrogen or other inert gases can be used. Alternatively, reducing gas or oxidizing gas can be mixed in the buffer tank 73 at an appropriate mixture ratio according to the amount of foreign substances adhered to the surface of the wire 12 and supplied to the plasma generating chamber 41. Although the present embodiment describes the case of supplying plasma generating gas from the gas bottle 84, the gas can be supplied externally through an exclusive duct without being restricted to being supplied from the gas bottle 84. Also, in the case of mixing reducing gas or oxidizing gas, each gas can be supplied from different gas bottles or through exclusive ducts provided separately.

In addition to the same effects as in the first and third embodiments, the present embodiment exhibits an effect that since the amount of gas after cleaning discharged from the wire cleaning guide 31 around the wire bonding apparatus 11 is very small, the periphery of the wire bonding apparatus 11 can be kept in a clean environment to achieve an improvement in bonding quality. Also, the gas circulation system exhibits an effect that gas can be reused, resulting in a reduction in the amount of plasma generating gas utilized.

Although the present embodiment describes a gas circulation/purification system, gas discharge lines can be connected to the discharge nozzles 54 and 57 to, for example, discharge gas outside the building in which the bonding apparatus is placed, or the gas after cleaning can be disposed of after being stored in a discharge gas tank or the like to keep the periphery of the bonding apparatus in a clean environment.

Although the foregoing embodiments describe the cases of applying the present invention to wire bonding apparatus 11, the present invention can be applied not only to wire bonding apparatus 11 but also to other bonding apparatuses that use wires such as bump bonding apparatuses.

The invention claimed is:

1. A wire cleaning guide for guiding a wire in a feed direction and to clean the wire, comprising:
   a gas supply nozzle for supplying plasma generating gas;
   a plasma generating chamber with plasma generating gas supplied from the gas supply nozzle thereto for transforming the plasma generating gas into plasma by energizing a bonding wire that passes there through to clean the wire by means of the plasma gas, said plasma generating chamber being installed between a wire feeder and a bonding tool; and
   wire-feeder-side and bonding-tool-side guide holes for guiding the wire in the feed direction, the diameter of the wire-feeder-side guide hole is greater than that of the bonding-tool-side guide hole so that the outflow rate of gas after wire cleaning flowing between the wire-feeder-side guide hole and the wire is greater than that of gas after wire cleaning flowing between the bonding-tool-side guide hole and the wire.

2. The wire cleaning guide according to claim 1, further comprising insulation bushings being provided in the holes for electrically insulating between the wire and the plasma generating chamber.

3. The wire cleaning guide according to claim 1, further comprising a dielectric holding coil provided in the plasma generating chamber along the wire feed direction and having a center hole for inserting the wire there through.

4. A wire cleaning guide for guiding a wire in a feed direction and to clean the wire, comprising:
- a gas supply nozzle for supplying plasma generating gas; and
- a plasma generating chamber with plasma generating gas supplied from the gas supply nozzle thereto for transforming the plasma generating gas into plasma by energizing a bonding wire that passes there through to clean the wire through the plasma gas, said plasma generating chamber including:
  - plasma space partition members provided, respectively, on the wire feeder side and the bonding tool side and each including a plasma attenuation hole for inserting the wire there through and for attenuating the plasma, and
  - covers provided on the wire feeder side and the bonding tool side of the respective plasma space partition members and each including a guide hole for guiding the wire in the feed direction and a gas discharge nozzle for discharging gas after wire cleaning out of said plasma generating chamber, wherein a diameter of said guide hole for guiding the wire is substantially larger than a guide hole for said gas discharge nozzle.

5. The wire cleaning guide according to claim 4, further comprising a dielectric holding coil provided in the plasma generating chamber along the wire feed direction and having a center hole for inserting the wire there through.

6. A wire cleaning guide for guiding a wire in a feed direction and to clean the wire, comprising:
- a gas supply nozzle for supplying plasma generating gas; and
- a plasma generating chamber with plasma generating gas supplied from the gas supply nozzle thereto for transforming the plasma generating gas into plasma by energizing a bonding wire that passes there through to clean the wire through the plasma gas, said plasma generating chamber including:
  - plasma space partition members provided respectively on the wire feeder side and the bonding tool side and each including a plasma attenuation hole for inserting the wire there through and for attenuating the plasma,
  - covers provided on the wire feeder side and the bonding tool side of the respective plasma space partition members and each including a guide hole for guiding the wire in the feed direction and a gas discharge nozzle for discharging gas after wire cleaning out of said plasma generating chamber, and
- a gas purification mechanism including a filter for filtering foreign substances in the gas after wire cleaning discharged through each gas discharge nozzle and a recirculation flow path for resupplying the gas passing through the filter to said plasma generating chamber as plasma generating gas.

* * * * *